United States Patent
Bruinsma et al.

(10) Patent No.: US 7,148,494 B2
(45) Date of Patent: Dec. 12, 2006

(54) LEVEL SENSOR, LITHOGRAPHIC APPARATUS AND DEVICE MANUFACTURING METHOD

(75) Inventors: Anastasius Jacobus Anicetus Bruinsma, Delft (NL); Frank Staals, Eindhoven (NL); Robert Jan Van Wijk, Valkenswaard (NL); Stoyan Nihtianov, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 161 days.

(21) Appl. No.: 11/022,593

(22) Filed: Dec. 29, 2004

(65) Prior Publication Data
US 2006/0138347 A1    Jun. 29, 2006

(51) Int. Cl.
*A61N 5/00* (2006.01)
(52) U.S. Cl. .............................. 250/491.1; 250/492.1; 356/401
(58) Field of Classification Search .............. 250/492.1
See application file for complete search history.

(56) References Cited
U.S. PATENT DOCUMENTS
3,985,030 A    10/1976    Charlton

FOREIGN PATENT DOCUMENTS

| JP | 56-138217 A | 10/1981 |
|---|---|---|
| JP | 62-272259 A | 11/1987 |
| JP | 6-260393 A | 9/1994 |
| JP | 11-176727 A | 7/1999 |
| JP | 2001-267224 | 9/2001 |

OTHER PUBLICATIONS

European Search Report issued in EP Application No. 05112705.8 dated Apr. 19, 2006.

*Primary Examiner*—Nikita Wells
*Assistant Examiner*—Phillip A. Johnston
(74) *Attorney, Agent, or Firm*—Pillsbury Winthrop Shaw Pittman, LLP

(57) ABSTRACT

The invention relates to a level sensor for use in a lithographic apparatus that determines a surface height of a substrate. The level sensor includes an emitter and a receiver, wherein the emitter is arranged to emit a signal directed to a predetermined position on the surface of the substrate, such that the signal is at least partially reflected by the substrate to render a reflected signal. The receiver is arranged to receive at least part of the reflected signal, and the level sensor is arranged to determine the surface height of the substrate with respect to the level sensor based on the emitted and received signal. The signal includes a pressure wave.

17 Claims, 7 Drawing Sheets

LEVEL SENSOR, LITHOGRAPHIC APPARATUS AND DEVICE MANUFACTURING METHOD

FIELD OF THE INVENTION

The invention relates to a lithographic apparatus. More particularly, the invention relates to a level sensor for use in a lithographic apparatus for determining a height of a surface of a substrate.

The invention further relates to a lithographic projection apparatus and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) of a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Although specific reference may be made herein to the use of lithographic apparatuses in the manufacture of ICs, it should be understood that the lithographic apparatuses described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in a track tool that typically applies a layer of resist to a substrate and develops the exposed resist, a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example, imprint lithography, and where the context allows, is not limited to optical lithography. In imprint lithography a topography in a patterning device defines the pattern created on a substrate. The topography of the patterning device may be pressed into a layer of resist supplied to the substrate, whereupon the resist is cured by applying electromagnetic radiation, heat, pressure or a combination thereof. The patterning device is moved out of the resist, leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5–20 nm), as well as particle beams, such as ion beams or electron beams.

The term "lens", where the context allows, may refer to any one or combination of various types of optical components, including refractive, reflective, magnetic, electromagnetic and electrostatic optical components.

The position of the substrate should be known accurately with respect to a projection system used to apply the desired pattern onto the substrate. The projection system focuses the radiation beam that is provided with a pattern by the patterning device onto the substrate. In order to achieve optimal results, first height measurements are performed for the surface of the substrate, generating height data. Such height data may include information about the morphology of the surface of the substrate. In case a lithographic apparatus having two or more substrate tables (dual stage) is used, the height measurements may be performed on a first position (measurement position), while the exposure is done at a second position (exposure position). In that case, the height data obtained at the first position could be stored in a height map for later use during exposure at the second position. The height map consists of a set of data representing the height of the surface of the substrate with respect to a reference level at different positions on the substrate. However, the height measurements may also be performed on-the-fly (during exposure) and used in real-time during the exposure, for instance in case a single stage machine is used.

The height data is used to position the substrate during exposure as accurate as possible with respect to the projection system, taking into account the local and global shape of the substrate. Based on the height data, the relative position of the substrate with respect to the projection system can be adjusted for each target portion or even for different parts of a target portion.

Several level sensors are known that are arranged to obtain such height data. For instance, level sensors are known that optically measure the height of the substrate by projecting a radiation beam at an angle to the position on the substrate of which the height is to be measured. The level sensor comprises an array of sensors that each can detect a reflected beam. The reflected beam will hit one or more sensors depending on the height of the surface of the substrate at the position of the reflection. So, the height of the substrate at the position of the reflection can be determined.

The space between the projection lens and the substrate is rather small. In order to achieve higher numerical apertures, this space will become even smaller in future systems. Therefore, space that is available for the radiation beam and the reflected beam is becoming smaller and, as a result of this, fewer locations are available for positioning a level sensor.

Furthermore, optical level sensors may not be easily compatible in some instances with immersion techniques, in which part of the substrate is immersed. In lithographic machines using immersion techniques, part of the space between the projection lens and the substrate is filled with liquid, such as water. Devices, such as seals, are provided that keep the liquid in place. The radiation beam emitted by the optical level sensor that is positioned outside the seal should be guided through the seal to reach the surface of the substrate. This may be a somewhat difficult task to perform.

Also, radiation beams reflected by the top surface of the substrate may suffer from process dependencies. Process dependencies may be caused, for instance, by the fact that the radiation beam emitted by the level sensor is not only reflected by the top surface of the substrate, but also by sub-layers that are positioned under the top layer that may disturb the measurement. This disturbance is process dependent, i.e. it depends on the processes previously carried out on the substrate that determine the morphology of the sub-layers. Process dependencies may also be caused by phase shifts caused by reflections of metal surfaces.

The radiation beam may be reflected by a number of (sub-) layers and may combine to form one single reflected beam. The reflected beam can be thought of as a single beam reflecting once, somewhere below or above the surface of the substrate.

Other level sensors are known, such as capacitive or inductive level sensors. However, it will be understood that these level sensors may also suffer from process dependencies, since the electro-magnetic characteristics of the substrate may depend on the processes previously carried out on the substrate.

According to another type of level sensor, an air stream is used to determine the height of a substrate. This type of level sensor is called an air gauge and comprises an air outlet through which an air stream is directed. The outlet is positioned in the vicinity of the substrate and is directed perpendicular to the surface of the substrate. The air is thus directed to the surface of the substrate. Height differences of the substrate cause differences in the distance between the outlet of the air gauge and the substrate. The air gauge will therefore experience fluctuations in the resistance of the air flow that correspond to height fluctuations of the surface of the substrate. The resistance of the air flow is measured, from which height information is deduced. This could be done at different positions above the substrate to make an height map.

Such an air gauge is, however, a relatively slow level sensor, which may reduce the throughput of the system. Furthermore, the distance between the outlet and the surface of the substrate needs to be relatively small in order to perform accurate measurements. This requires accurate control mechanisms. Also, the air gauge can not be used in a single stage immersion lithographic apparatus.

SUMMARY

It is desirable to provide level sensors that overcome one or more of the above mentioned disadvantages. In general, it is an object of the invention to provide an improved level sensor.

According to an aspect of the invention, there is provided a level sensor wherein the signal is a pressure wave. The use of a pressure wave is a fast method that could be used in all kinds of circumstances, such as in lithographic machines using immersion techniques.

Using pressure waves to measure a height map of a substrate is a useful alternative to conventional level sensors.

Pressure waves are minimally affected by process dependencies, in particular when used in (low pressure) air.

In one embodiment, the invention is advantageous when used in combination with ultrasonic pressure waves, having a frequency above approximately 20 kHz. These pressure waves have properties that may advantageously be used for determining a height map of a substrate. Due to their high traveling speed and relatively small wavelength, fast and accurate measurements are possible. These positive properties of ultrasonic pressure waves are specifically present in lithographic projection apparatus using immersion techniques.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
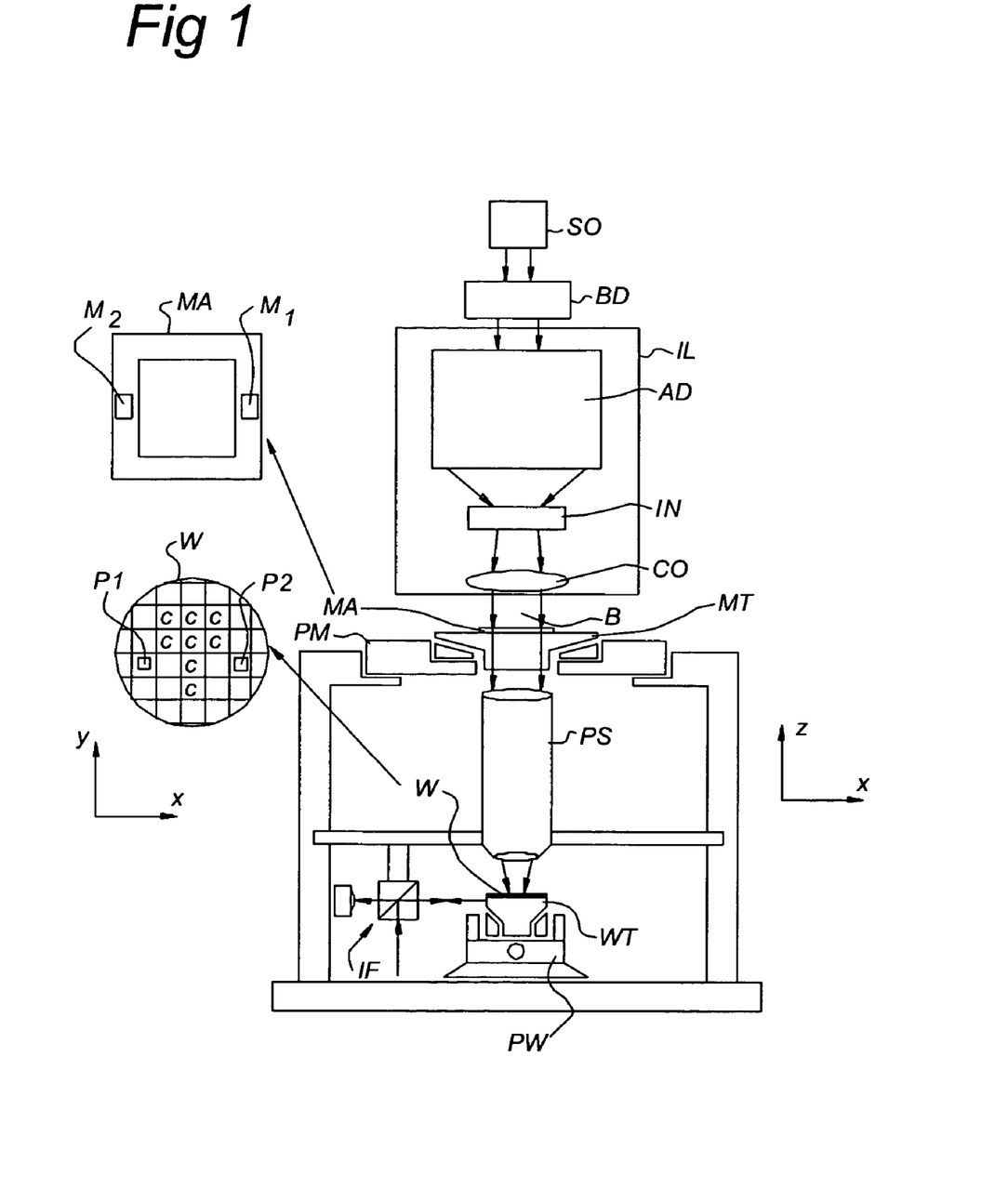
FIG. 1 depicts a lithographic apparatus according to an embodiment of the invention.

FIG. 1 schematically depicts a lithographic apparatus according to one embodiment of the invention. The apparatus includes:

an illumination system (illuminator) IL configured to condition a radiation beam B (e.g. UV radiation, EUV radiation, or other radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as, for example, whether or not the patterning device is held in a vacuum environment. The support structure may use mechanical, vacuum, electrostatic or other clamping techniques to hold the patterning device. The support structure may be a frame or a table, for example, which may be fixed or movable. The support structure may ensure that the patterning device is at a desired position, for example, with respect to the projection system. Any use of the terms "reticle" or "mask" herein may be considered synonymous with the more general term "patterning device."

The term "patterning device" used herein should be broadly interpreted as referring to any device that may be used to impart a radiation beam with a pattern in its cross-section, such as to create a pattern in a target portion of the substrate. It should be noted that the pattern imparted to the radiation beam may not exactly correspond to the desired pattern in the target portion of the substrate, for example, if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography and include mask types such as binary, alternating phase-shift, and attenuated phase-shift, as well as various hybrid mask types. An example of a programmable mirror array employs a matrix arrangement of small mirrors, each of which may be individually tilted so as to reflect an incoming radiation beam in different directions. The tilted mirrors impart a pattern in a radiation beam that is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered synonymous with the more general term "projection system".

As here depicted, the apparatus is of a transmissive type (e.g. employing a transmissive mask). Alternatively, the apparatus may be of a reflective type (e.g. employing a programmable mirror array or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein is not intended to suggest that a structure, such as a substrate, must be submerged in liquid, but rather means that liquid is located between the projection system and the substrate during exposure.

Referring to FIG. 1, the illuminator IL receives a radiation beam from a radiation source SO. The source and the lithographic apparatus may be separate entities, for example, when the source is an excimer laser. In such cases, the source is not considered to form part of the lithographic apparatus and the radiation beam is passed from the source SO to the illuminator IL with the aid of a beam delivery system BD including suitable directing mirrors and/or a beam expander or other beam delivery systems. In other cases, the source may be an integral part of the lithographic apparatus, for example, when the source is a mercury lamp. The source SO and the illuminator IL, together with the beam delivery system BD, if used, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator may be adjusted. In addition, the illuminator IL may include various other components, such as an integrator IN and a condenser CO. The illuminator may be used to condition the radiation beam to have a desired uniformity and intensity distribution in its cross-section.

The radiation beam B may be incident on the patterning device (e.g., mask MA), which is held on the support structure (e.g., mask table MT), and may be patterned by the patterning device. Having traversed the mask MA, the radiation beam B may pass through the projection system PS, which focuses the beam onto a target portion C of the substrate W. With the aid of the second positioner PW and position sensor IF (e.g. an interferometric device, linear encoder or capacitive sensor), the substrate table WT may be moved accurately, e.g. so as to position different target portions C in the path of the radiation beam B. Similarly, the first positioner PM and another position sensor (which is not explicitly depicted in FIG. 1) may be used to accurately position the mask MA with respect to the path of the radiation beam B, e.g. after mechanical retrieval from a mask library or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks, as illustrated, occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT may be kept essentially stationary holding a programmable patterning device, The substrate table WT may be moved or scanned while a pattern imparted to the radiation beam is projected onto a target portion C. In this mode, generally a pulsed radiation source is employed and the programmable patterning device may be updated after each movement of the substrate table WT or in between successive radiation pulses during a scan. This mode of operation may be readily applied to maskless lithography that utilizes programmable patterning device, such as a programmable mirror array of a type as referred to above.

Combinations and/or variations on the above described modes of use or entirely different modes of use may also be employed.

The position of the substrate W should be known accurately with respect to the projection system PS. The projection system PS focuses the patterned radiation beam B onto the substrate W. In order to achieve optimal results, first height measurements are performed on the surface of the substrate, generating height data of the surface of the substrate W. Such height data may include information about the morphology of the surface of the substrate W. This information may be used to position the substrate W as accurately as possible with respect to the projection system PS during exposure, taking into account the local and global shape of the substrate W.

Many types of level sensors are known, but they all suffer from certain disadvantages as discussed above. According to the invention, a new type of level sensor is introduced based on acoustic principles, using pressure waves to determine height data.

It should be noted that the idea of constructing a height measurement device that is based on acoustic principles may be used in other fields of technology, such as the field of geology and in the medical and biological field for making scans of bodies. However, the resolution and accuracy that are traditionally associated with such acoustic techniques were thought to make them unsuitable for use in lithographic machines.

For instance, the use of ultrasonic transducer based on MEMS technology allow the emission pressure waves to have relatively high frequencies. A frequency of 10 MHz and higher in air may be achieved currently. Higher frequencies reduce sensitivities to environmental conditions and provide a smaller dead zone.

EMBODIMENT 1

Figure 2:
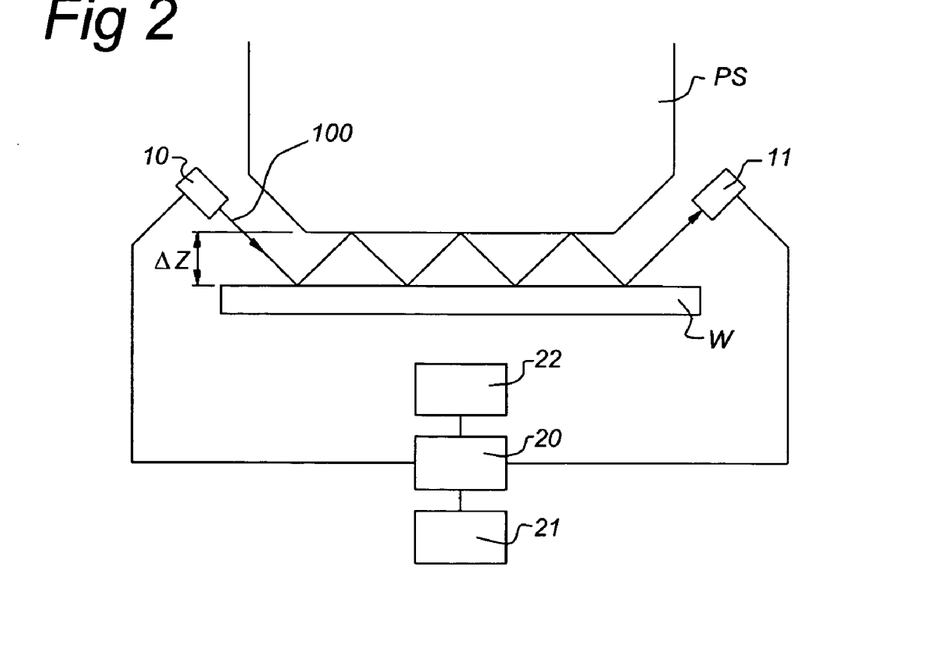
FIG. 2 depicts a level sensor according to a first embodiment of the invention.

According to a first embodiment of the invention, the height structure of a substrate W may be measured using pressure waves or pressure pulses as, for instance, ultrasound or other pressure waves. The pressure wave may be directed toward the substrate such that it is substantially not perpendicular with respect to the surface of the substrate W. FIG. 2 shows a schematic view of such a measurement system.

FIG. 2 shows a projection system PS positioned above a substrate W. Also a sound transmitter 10 and a receiver 11 may be provided. The transmitter 10 may be arranged to generate a pressure wave 100, such as an ultrasonic signal, that may be detected by the receiver 11. The transmitter 10 and the receiver 11 both may be arranged to communicate with a processor 20. The processor 20 may be arranged to control the transmitter 10 and receive signals from the receiver 11, representing the signal detected by the receiver 11. The processor 20 is further arranged to communicate with a memory device 21 and a clock 22.

According to this embodiment, the processor 20 may trigger the transmitter 10 to generate a pressure wave 100. As can be seen in FIG. 2, the pressure wave 100 may be reflected by the surface of the substrate W and the lower surface of the projection system PS, which lower surface faces the substrate W (or substrate table WT when no substrate W has been placed). The number of reflections may be varied by varying the angle at which the pressure wave is emitted towards the substrate W, as long as the pressure wave 100 is at least once reflected by the surface of the substrate W.

According to a preferred embodiment, the pressure wave is also at least once reflected by the projection system PS, as this generates direction information about the distance between the substrate W and the projection system PS, which is used to focus the projection beam PB.

If the pressure wave is reflected by the substrate W (only one reflection), information may be obtained about the height of the substrate with respect to the level sensor used. This information should then be translated to information about the distance between the projection system PS and the substrate W. Therefore, the relative position of the projection system PS with respect to the substrate W should be known.

The pressure wave 100 may be detected by the receiver 11. The processor 20 may receive a signal from the receiver 11 indicating that a signal is detected.

The processor 20 may measure the time $t_0$ at which the transmitter 10 emits the signal and the time $t_1$ at which the receiver 11 receives the signal. The processor 20 may determine the time $t_0$ and $t_1$ using clock 22. It will be understood that $\Delta t = t_1 - t_0$ is a measure for the distance $\Delta z$ between the projection system PS and the substrate W. Once the traveling time $\Delta t$ is determined, the traveling distance may be computed, since the traveling speed of the pressure wave is known. Using elementary goniometry in combination with the angle at which the pressure wave 100 is emitted with respect to the surface of the substrate W, the distance $\Delta z$ may be computed. The processor 20 may store the determined value of $\Delta z$ in the memory device 21.

It will be understood that the number of reflections between the surface of the substrate W and the projection system PS may influence the sensitivity of the measurement. The more reflections, the longer the traveling distance of the pressure wave 100, and the higher $\Delta t$ will be. As a result thereof, $\Delta t$ may be measured with a higher accuracy and the dependency of $\Delta t$ from variations of $\Delta z$ will also be stronger.

Figure 3:
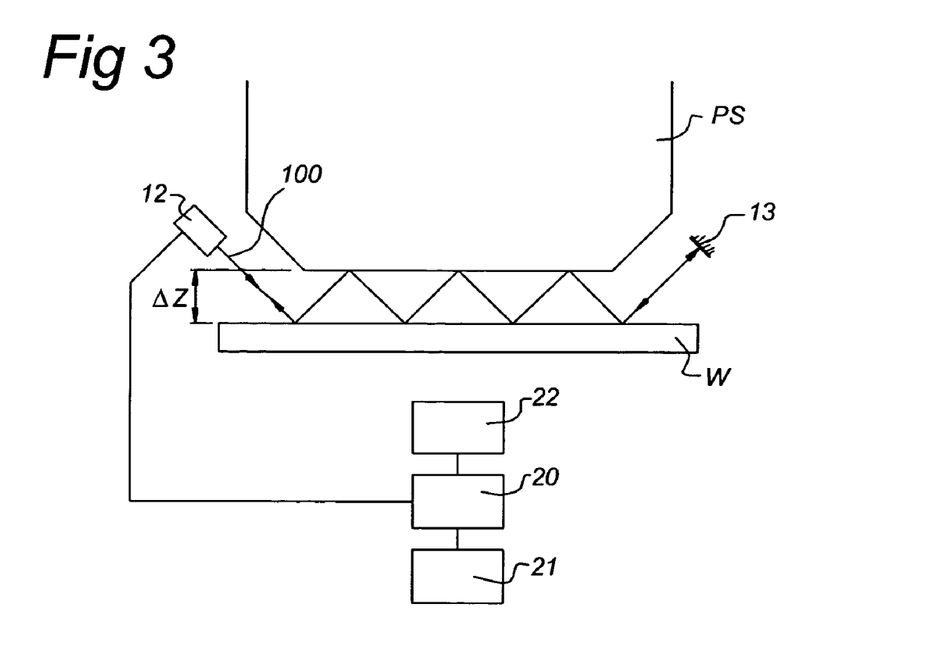
FIG. 3 depicts a level sensor according to an alternative of the first embodiment of the invention.

According to an alternative, shown in FIG. 3, the sensitivity of the measurement may be doubled by replacing the transmitter with a transducer 12 and the receiver 11 with a mirror 13. In one embodiment of the invention, the mirror 13 should be a "sound mirror" or an ultrasonic mirror that is capable of reflecting the pressure wave 100. In case ultrasound is used, this should be an ultrasonic mirror. The transducer 12 may be arranged to generate and detect pressure waves.

The pressure wave 100 may be emitted by the transducer 12 and is reflected by the mirror 13. The pressure wave 100 travels back to the transducer 12, that detects the pressure wave 100. Again, $\Delta t$ may be determined by the processor 20. It will be understood that according to this alternative, the pressure wave 100 may travel twice the distance compared with the alternative depicted in FIG. 2. The travelling time $\Delta t$ is doubled, and also the variations in $\Delta t$ due to variations in $\Delta z$ are twice as big as in the embodiment shown in FIG. 2. As a result of this, the sensitivity may be doubled.

Figure 4A:
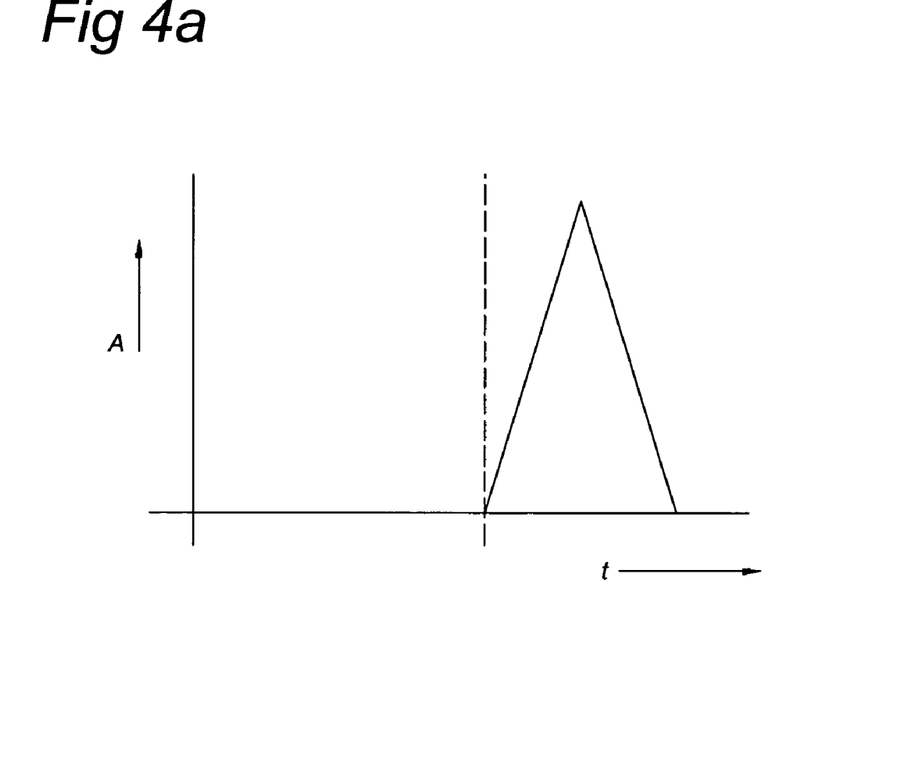
FIGS. 4a and 4b depict graphs of the emitted and received pressure waves according to the first embodiment of the invention.
Figure 4B:
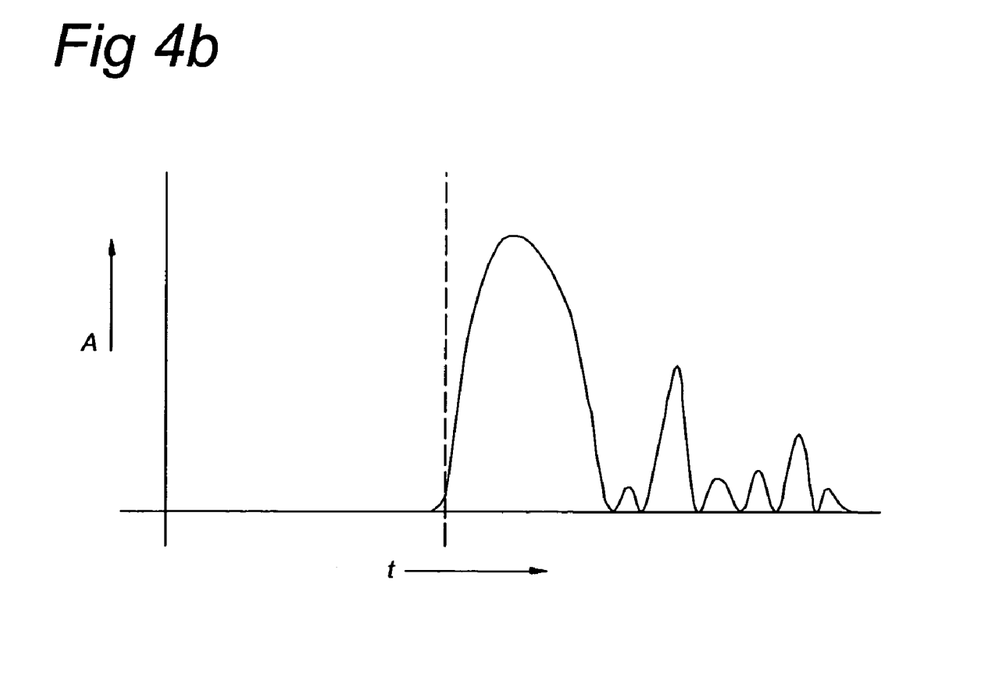

As already mentioned above, the transmitter 10 or the transducer 12 may emit ultrasonic pressure waves 100. The transmitter 10 or the transducer 12 may start emitting at $t_0$, and the receiver 11 or transducer 12 should determine the time of arrival $t_1$ of the pressure wave 100. Therefore, it is sufficient that a small peak is emitted, as for instance shown in FIG. 4a, of which the front edge, indicated by the dotted line in FIG. 4b, is used to determine the time of arrival. FIGS. 4a and 4b both show a graph of the intensity of the signal A (vertical axis) plotted against the time t (horizontal axis). The receiver 11 or transducer 12 may detect a signal that is deformed with respect to the emitted signal, as depicted in FIG. 4b. The detected signal may contain all sorts of disturbances and echo's, caused by unwanted reflections to different layers formed below the surface of the substrate W. However, the front edge of the detected signal may be a correct measure of the travelling time and $\Delta z$, since the relevant pressure wave 100 has travelled the shortest route. Therefore, this method does not suffer from these errors.

FIG. 4a shows a triangular shaped peak emitted by the transmitter 10, transducer 12, or other device. However, it will be understood that peaks having different shapes may be emitted, such as block shaped pulses. It will be understood that pulses are preferred for carrying out this invention. Alternatively, continuous-wave signals may be used with phase-shift detection, for instance, by using interferometrical techniques.

The emitted pressure wave 100 should be a well collimated beam to prevent that part of the pressure wave 100 from taking a short-cut to the receiver and arriving at the receiver after fewer reflections than intended by the substrate W and/or projection system PS. This may lead to erroneous measurements.

According to a further embodiment, the level sensor as described here may be used in a lithographic apparatus of a type wherein at least a portion of the substrate W may be covered with a liquid having a relatively high refractive index to fill a space between the projection system PS and the substrate W.

Figure 5:
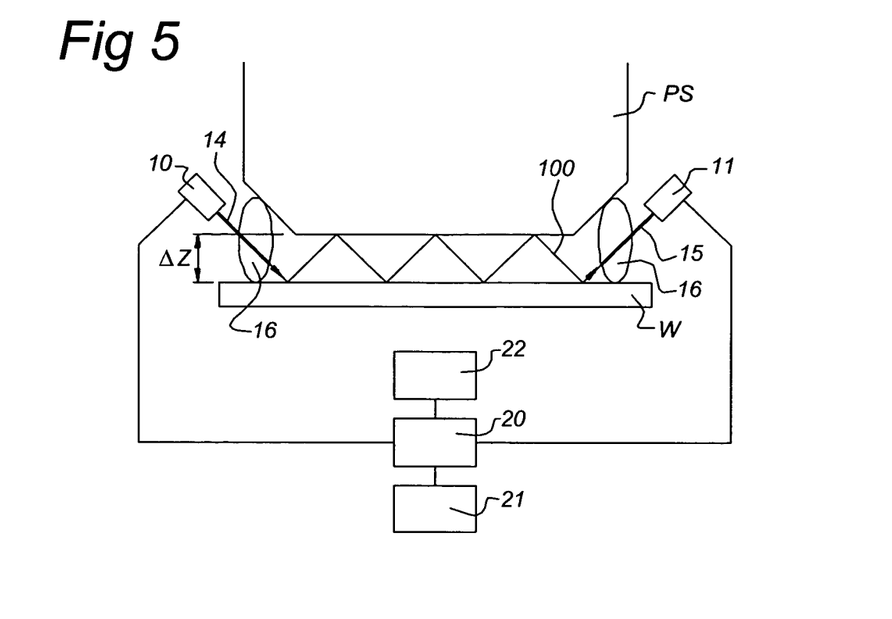
FIG. 5 depicts a level sensor according to a further alternative of the first embodiment of the invention.

FIG. 5 depicts an embodiment in which a liquid, e.g. water, is provided in between the substrate W and the projection system PS. The liquid may be contained by a seal 16. This technique is generally referred to as immersion. More details about immersion may be found in EP 1 420 298 A2, EP 1 429 188 and EP 1 420 300 A2.

The transmitter 10 and the receiver 11 both may be provided with probes 14, 15 that guide the generated pressure waves 100 through the seal 16 into the fluid. It will be understood by a person skilled in the art that pressure waves advantageously may be used in combination with immersion, since the liquid will transmit the pressure waves 100 with relatively small losses and at high speed, compared with air. This increases the accuracy as it allows an increased number of measurement positions or measurements per position.

The transmitter 10, transducer 12, or other device may generate ultrasound, i.e. having a frequency above 20 kHz, for instance 20 MHz. It is known that guiding ultrasound from a source to air is rather difficult due to unwanted reflection, while guiding ultrasound from a source to liquid is relatively easy. This is another advantage of combining the invention with immersion.

A typical number for the reproducibility (4 sigma or 4-$\sigma$) of current devices in air is 0.4% of the wavelength for a single measurement. Due to a lower attenuation, higher frequencies (smaller wavelengths) may be used in water than in air. In air 9 MHz may be feasible, which at a sound velocity of 345 m/s gives a wavelength of 38 µm. However, in water, 260 MHz may be used, which at a sound velocity of 1480 m/s gives a wavelength of 5.7 µm.

This leads to a 4-$\sigma$ reproducibility of 0.15 µm in air and 23 nm in water, both for a single measurement. By averaging over more than one measurement, the reproducibility improves in a square-root dependence. By averaging over 500 measurements, the 4-$\sigma$ reproducibility in water may be reduced to about 1 nm. In air, this takes averaging over about 23,000 measurements.

In a two-way path setup, the transmitter also may be used as the receiver. Then the number of measurements per second is limited by the path length (should be short), the dead-time, and other factors. However, in the present embodiment, the transmitter and receiver may be separated and the choice of measurement frequency may not be restricted by these considerations.

Figure 6:
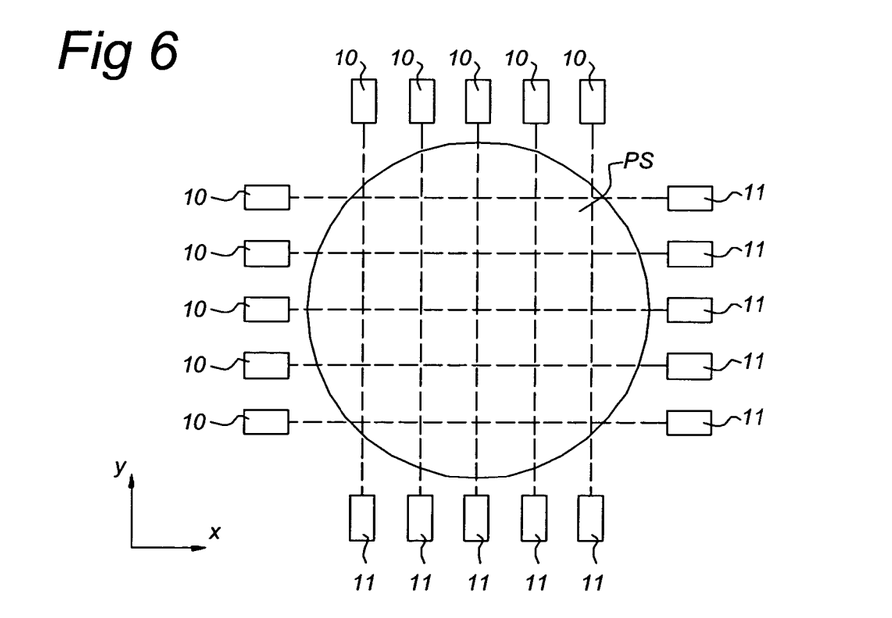
FIG. 6 depicts a top view of a possible set-up according to an embodiment of the invention.

A single pair including transmitter 10 and receiver 11 provides information about the height along a single line across the surface of the substrate W, as indicated by the dotted lines in FIG. 6. A top view of the measurement system according to the invention is illustrated in FIG. 6. The circle indicates the projection system PS. The $\Delta z$ that is determined is a measure of the average distance along a line between the substrate W with respect to the projection system PS and is not a point measurement. It will be understood, however, that in order to project the radiation beam B in an accurate way to a target portion C of the substrate W, the resolution should be increased. Thus, $\Delta z$ is preferably known at a single point, instead of along a line. High resolution is desired, for instance, providing more than one $\Delta z$ for a target portion C.

In one embodiment illustrated in FIG. 6, a number of transmitters 10 and receivers 11 may be provided. FIG. 6 depicts five transmitters 10 and receivers 11 that are arranged to measure along lines across the surface of the substrate W in the x direction, and five transmitter 10 and receivers 11 that are arranged to measure along lines across the surface of the substrate W in the y direction. The x and y direction are indicated in FIG. 6. Although not depicted, it will be understood that all receivers 10 and transmitters 11 are arranged to communicate with a processor 20, similar to the alternatives described above.

Each pair provides height information along the dotted line located in between them, as indicated in FIG. 6. As a result of the measurements, ten different values for $\Delta z$ may be generated, five values $\Delta z(x_i)$ in the x direction and five values $\Delta z(y_j)$ in the y direction.

In the example of FIG. 6, ten different values for $\Delta z$ are generated, which include height information of overlapping regions of the surface of the substrate W. This information should be processed to reconstruct local height information. In one embodiment, a model of the surface of the substrate W may include Fourier components or Zernike polynomials. Zernike polynomials are specially designed for disk-shaped surfaces, such as the circular region under the projection system PS, depicted in FIG. 6. The first Zernike order describes very global surface curvatures, while higher orders provide more detailed information. When a number of different values for $\Delta z$ are determined, more Zernike orders may be computed to provide more detailed information about the surface of the substrate W.

These mathematical techniques are used in tomography, where many techniques are used to reconstruct objects from multiple scans (ultrasound scans, CT scans). Such techniques are, for instance, used in the field of medical imaging.

It is also possible to provide more or fewer pairs of transmitters 10 and receivers 11. It is also possible to provide only a single pair of transmitters 10 and receivers 11 in each direction and increase the resolution by carrying out a number of measurements along different lines with respect to the substrate W using the single pair. This could be achieved by moving the substrate W and/or the transmitter/receiver 10/11 with respect to each other in between successive measurements.

Furthermore, it is possible to use a single pair that includes transmitter 10 and receiver 11 and use them to perform measurements in both directions by rotating the transmitter/receiver 10/11 and the substrate W relative to each other. In fact, all sorts of combinations may be used.

The transmitters 10 used according to this embodiment preferably emit a "collimated" bundle of pressure waves 100. A collimated bundle should be used to prevent a part of the bundle from taking a short-cut to the receiver, as discussed above. Also, especially in the embodiment illustrated in FIG. 6, where a number of transmitters 10 and receivers 11 are used, the bundle should not fan out in such a way that an emitted bundle reaches unintended receivers 11 than differ from the intended receiver 11. This problem may, however, be avoided by making the transmitters 10 emit at successive points in time, instead of all at the same time. In that case unwanted interference between different pairs of transmitters 10 and receivers 11 may be prevented or minimized.

In an alternative embodiment, if the emitters are controlled to emit successively in time, a pressure wave could be emitted that is not very well collimated, or even made diverging on purpose, so it reaches more than one receiver 11. This could provide extra information about $\Delta z$ along more than one line at the same time. The measurement system as described above may be used in single stage machines, but may also advantageously be used in so called "multiple stage" machines. In case multiple stage machines are used, the measurements may be performed at a measurement position, where no projection system PS is present. In that case, the projection system PS may be replaced by a reflection surface, replacing the projection system PS. The emitted pressure waves 100 may then be reflected by the reflection surface. In order to use the obtained measurement data at the exposure position, the relative position of the reflection surface and the substrate table WT should be known accurately. However, it will be understood that the invention may be used in a single stage machine, especially in a machine in which immersion techniques are used.

EMBODIMENT 2

Figure 7:
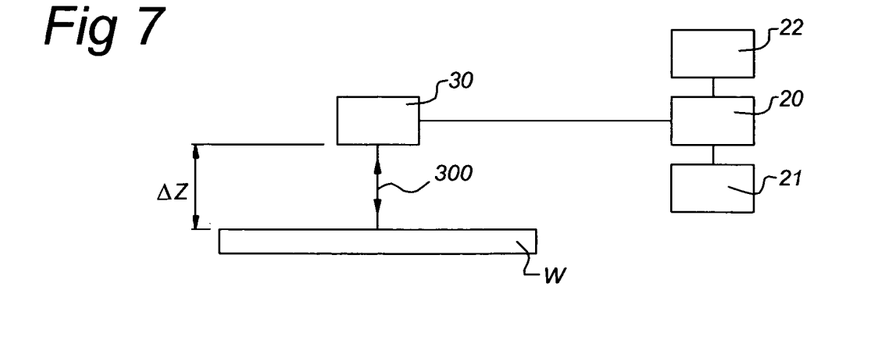
FIG. 7 depicts a level sensor according to a second embodiment of the invention.

According to a second embodiment of the invention pressure waves 300 are used to determine a height map, where the pressure waves 300 are directed substantially perpendicular with respect to the surface of the substrate W, in such a way that the pressure waves 300 are reflected by the substrate W at one known position. FIG. 7 shows a level sensor 30 according to this embodiment. Therefore, instead of providing height information along a line, height information may be obtained at a single point.

In one embodiment of the invention, the level sensor 30 may be positioned above a substrate W and may include an emitter and a receiver that are incorporated in a single device called a transducer. The level sensor 30 may be arranged to emit a pressure wave 300, for instance, an ultrasonic pressure wave, having a frequency above 20 kHz. The level sensor 30 may be arranged to communicate with a processor 20. The processor may be arranged to communicate with a memory device 21 and a clock 22.

The processor 20 is arranged to control the level sensor 30 to emit an ultrasonic pressure wave 300 at time $t_0$, which may be measured by the processor using clock 22. The pressure wave emitted by the level sensor 30 may be reflected by the substrate W at a location x, y at the surface of the substrate W and may be detected by level sensor 30. This may be communicated to processor 20, which may measure the time $t_1$ of arrival of the reflected pressure wave using clock 22. The processor may compute the traveling time $\Delta t$ of the pressure wave 300: $\Delta t = t_1 - t_0$. From this, the processor can compute the height $\Delta z$ of the substrate W with respect to the level sensor 30. The height $\Delta z$ is stored in the memory device 21, together with information about the position of the reflection x, y on the substrate W. The position x, y could be determined from the second positioner PW and/or position sensor IF (e.g. an interferometric device, linear encoder, capacitive sensor, or other sensor) (not shown in FIG. 7).

This measurement procedure could be applied to a plurality of positions on the substrate W. All the measured data taken together may form height data of the substrate W that can be used to position the substrate W as accurately as possible with respect to the projection system PS during exposure. In case a dual stage machine is used, where the measurement is carried out at a first position and the exposure is carried out at a second position, the height data obtained at the first position may be stored in a height map for later use during exposure at the second position. In an alternative embodiment, it is also possible to measure the height of the substrate W during exposure and apply real-time processing of the information and use the determined height information directly to control the exposure. The level sensor 30 may be positioned next to the projection system PS in such a way that it can measure the height of the substrate W that is next to be exposed by the projection system PS.

Figure 8:
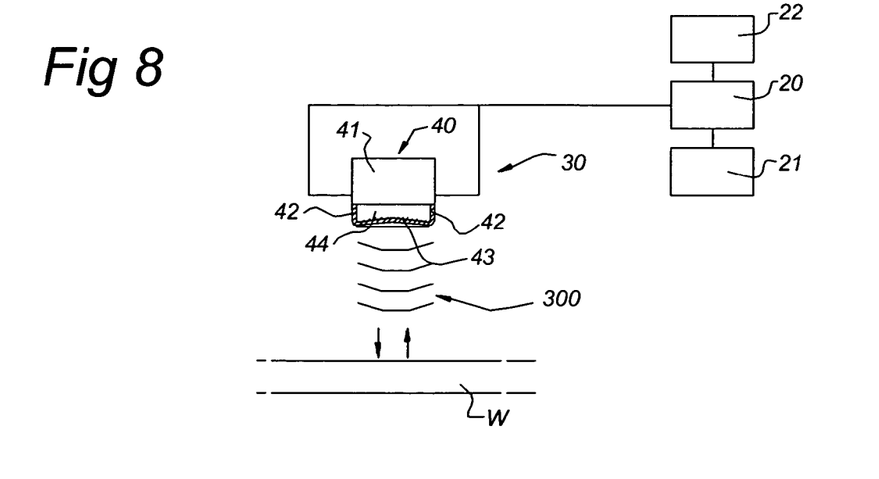
FIG. 8 depicts a possible set-up of the level sensor according to the second embodiment of the invention.
Figure 9:
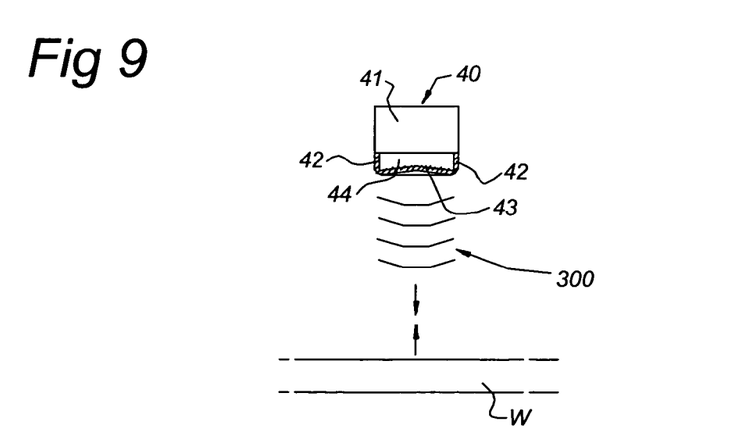
FIG. 9 depicts a level sensor according to an alternative of the second embodiment of the invention.

FIGS. 8 illustrates another embodiment of the level sensor 30, comprising an ultrasonic transducer 40, which is capable of transmitting an ultrasonic pressure wave 300 and detecting a reflected ultrasonic pressure wave 300. The transducer 40 is also shown separately in FIG. 9.

The ultrasonic transducer 40 as depicted in FIG. 8 may include a silicon substrate layer 41 on which nitride sidewalls 42 are formed. The nitride sidewalls 42 may support a membrane 43. In between the silicon substrate layer 41, the nitride sidewalls 42 and the membrane 43, a vacuum cavity 44 may be formed. The combination of these elements is also referred to as a micro-electromechanical system sensor (MEMS sensor).

The membrane 43 is a capacitive structure that can emit ultrasonic waves when a suitable voltage source is applied to it. This is further explained in:
"Curved Micromachined Ultrasonic Transducers" by K. A. Wong, S. Panda and I. Ladabaum, Sensant Corp. 14470 Doolittle Drive, San Leandro, Calif., U.S.A. 94577 (http://www.sensant.com/diagImag_recPubs.htm).

Further information can be found in—X. C. Jin, I. Ladabaum, F. L. Degertekin, S. Calmes, and B. T. Khuri-Yakub, "Fabrication and Characterization of Surface Micromachined Capacitive Ultrasonic Immersion transducers," IEEE JMEMS., vol. 8, no. 1, pp. 100–114, March 1999,
E. Cianci, V. Foglietti, D. Memmi, G. Caliano, A. Caronti, and M. Pappalardo, "Fabrication of Capacitive Ultrasonic Transducers by a Low Temperature and Fully Surface-Micromachined Process," Precision Engineering, vol. 26, no. 4, pp. 347–354, 2002, and
S. Panda, C. Daft, P. Wagner, I. Ladabaum, "Microfabfricated Ultrasonic Transducer (cMUT) Probes: Imaging Advantages Over PZT Probes," AIUM presentation, May 2003.

The silicon substrate layer 41 and the membrane 43 may be used as electrodes between which a DC bias voltage is applied, which establishes an electrical field that creates tension in the membrane. An AC voltage may also be applied to the membrane 43 and the silicon substrate layer 41, using the membrane 43 to vibrate and ultrasonic pressure waves may be generated. Of course, the level sensor 40, as depicted, could also be used to generate pressure waves having a lower frequency.

The ultrasonic transducer 40 provides several advantages over traditional piezoelectric sensors, which make it suitable for lithographic measurement purposes. In case a 100V DC bias voltage is applied upon which a 10V AC voltage is superimposed at a frequency of 2 MHz, a 110 dB dynamic range could be achieved, where the dynamic range is defined as the ratio of the amplitude of the strongest measurable signal to that of the noise floor. This is far better than traditional piezoelectric transducers.

Frequencies can be achieved between 200 kHz and 5 MHz, which offers advantages in the timing performance. Other frequencies may be used. The level sensor 30 according to this embodiment also allows for a reduction of the dead zone. The dead zone is the minimum required distance between the surface of the object to be measured (substrate W) and the level sensor 30. If the level sensor 30 is placed too close to the surface of the substrate W, the reflected wave may reach the transducer 40 when it is still transmitting. The leading edge of the emitted signal may strike the transducer 40 before the trailing edge has left the transducer 40. When this happens, the reflected signal may not be detected by the transducer as it is still in transmission mode. The reflected signal may even be reflected by the transmitting transducer and again be reflected by the substrate W. These phenomena may cause measurement errors when the level sensor 30 is placed in the dead zone. The ultrasonic beam generated by the ultrasonic transducer 40 is nearly unidirectional. This is particularly advantageous in applications in which a plurality of MEMS sensors are positioned next to each other.

According to an alternative embodiment of the invention, the distance between the level sensor 30 and the substrate W may not be determined by measuring the traveling time $\Delta t$, but may be determined by using a phase-shift algorithm to measure the distance. The principle of the phase-shift algorithm is similar to the principle used for interferometers. A part of the emitted wave front may be separated and the other part may be directed to the surface of the substrate W. This last part may be reflected by the substrate and may be guided such that it forms an interference pattern with the separated wave front. The technique of performing a phase-shift algorithm to measure distance is well known to a person skilled in the art.

In case a 2 MHz ultrasonic signal is emitted, a measurement accuracy of 0.5 μm can be obtained using the phase-shift algorithm in a single measurement.

Figure 10A:
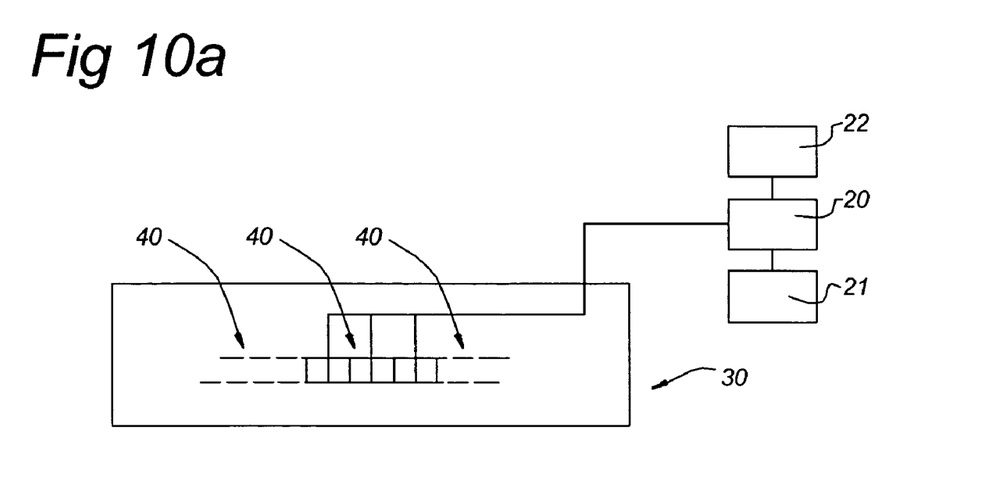
FIGS. 10a and 10b depict a side view and a bottom view of a level sensor according to a further alternative of the second embodiment of the present invention.
Figure 10B:
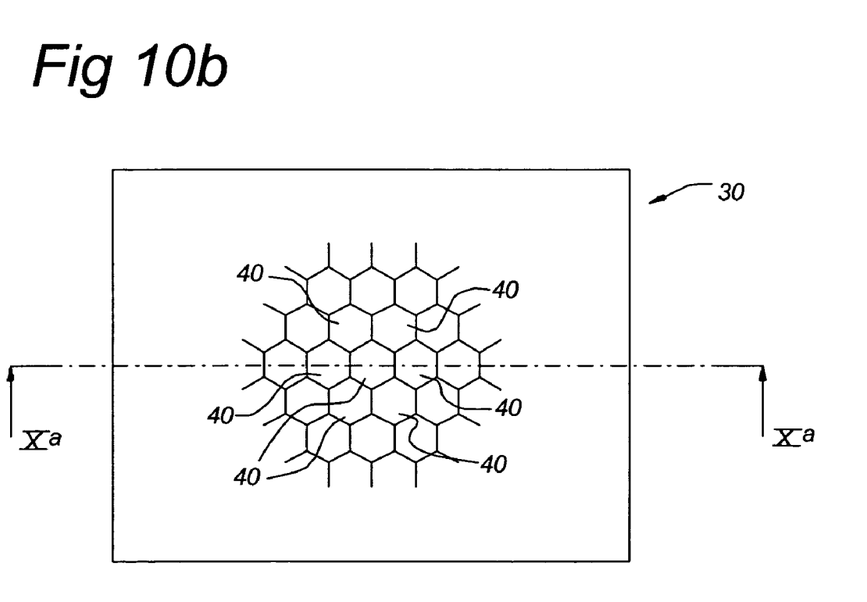

FIGS. 10a and 10b depict a further alternative of the second embodiment of the invention. FIG. 10a shows a side view of the level sensor 30 along line Xa depicted in FIG. 10b. FIG. 10b shows a bottom view of the level sensor 30.

The level sensor 30 shown in these figures may include a set of ultrasonic transducers 40 as shown in FIG. 8. All transducers 40 may be connected to the processor 20. Such a level sensor 30 may be positioned above the surface of the substrate W to perform height measurements as discussed above.

Since the level sensor 30 as shown in FIGS. 10a and 10b may include a set of ultrasonic transducers 40, various ways of operations are possible.

According to a first alternative embodiment of the invention, each transducer 40 may be used to emit a pressure wave 300 and to detect that same pressure wave 300 after it has been reflected by the substrate W. The height of the substrate W may be computed at the position of reflection, e.g. by measuring the traveling time or determining the phase shift. All transducers 40 could be controlled by the processor 20 to emit at the same time or, in order to prevent unwanted interferences, to emit successively in time. Other configurations may be used.

According to a second alternative, some transducers 40 may be used to emit pressure waves 300, while other transducers 40 may be used to detect pressure waves 300. In one embodiment of the invention, a first transducer 40 may be used to emit a pressure wave 300, while six transducers surrounding the first transducer 40 may be used to detect the reflected pressure wave 300. In this case, the emitted beam does not have to be perfectly unidirectional. By comparing the different signals received by the different transducers 40 used as receiver, additional information could be obtained about the precise morphology of the substrate W. For example, by comparing the intensity of the detected signal at the different transducers. It will be understood that many other alternative configurations may be used. The level sensor as depicted in FIGS. 10a and 10b could be used for all such alternatives since the way of operation could easily be controlled by the processor 20, and can easily be altered using conventional programming techniques.

The embodiment shown in FIGS. 10a and 10b may be manufactured in a relatively simple and inexpensive way, since the transducers 40 may be manufactured on a semiconductor substrate using lithographic techniques, benefiting from the economies of scale. It is relatively straightforward and inexpensive to produce such sets of transducers for high-volume applications that demand high-performance.

The embodiment shown in FIGS. 10a and 10b may further comprise a plurality of sets of transducers, where each set may include at least one transducer 40. A number of sets could be provided next to each other, for instance two rows of four. This allows measuring a larger part of the surface of the substrate at once. The level sensor 30 could then scan the surface of the substrate W using all sets. This may be done by moving the level sensor 30 with respect to the substrate, such that the surface of the substrate W may be measured. In a single stage machine, the level sensor may be positioned next to the lens so the height measurements may be performed during exposure and the position of the substrate may be adjusted based on the measured information in real-time.

Figure 11:
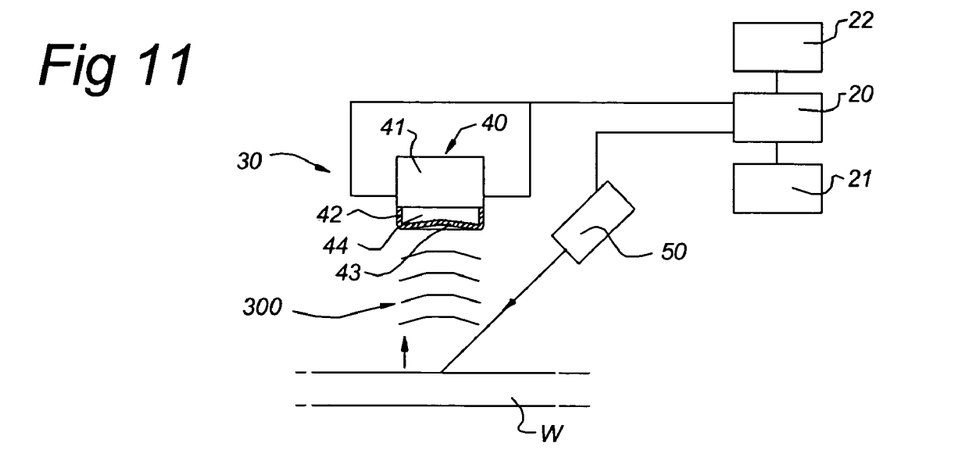
FIG. 11 depicts a further alternative of the second embodiment of the present invention.

According to a further embodiment of the invention, schematically depicted in FIG. 11, the level sensor 30 may further include a laser source 50 connected to the processor 20. The laser source 50 may generate a laser pulse that is directed to the position at the substrate W to be measured. Ultrasonic pressure waves will be emitted by the substrate W due to the laser pulse. The ultrasonic pressure waves may be induced by rapid local heating that takes place in the material due to the laser pulse. This principle is further explained in "Concept for a Micro Autonomous Ultrasound Instrument (MAUI)", William C. Wilson, Gary M. Atkinson, NDT.net, August 2004, Vol. 9, No. 08 (from "The e-Journal of Non destructive Testing": http://www.ndt.net/article/v09n08/wilson2/wilson2.htm).

Figure 12A:
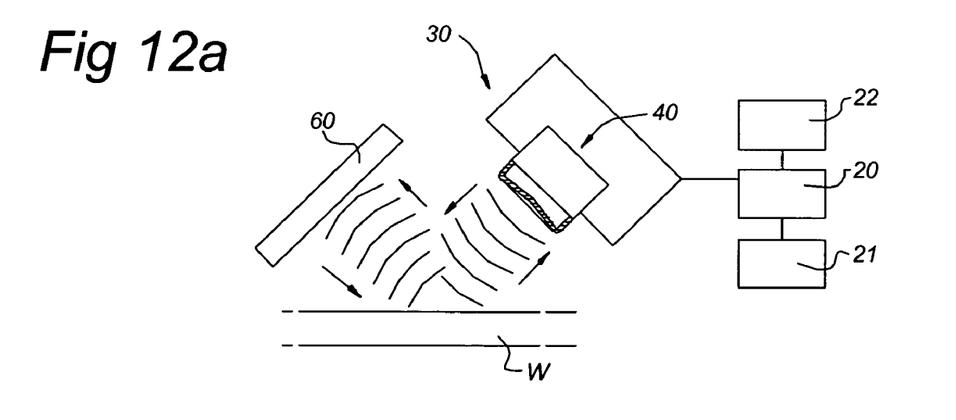
FIGS. 12a and 12b depict yet even further alternatives of the second embodiment of the present invention.
Figure 12B:
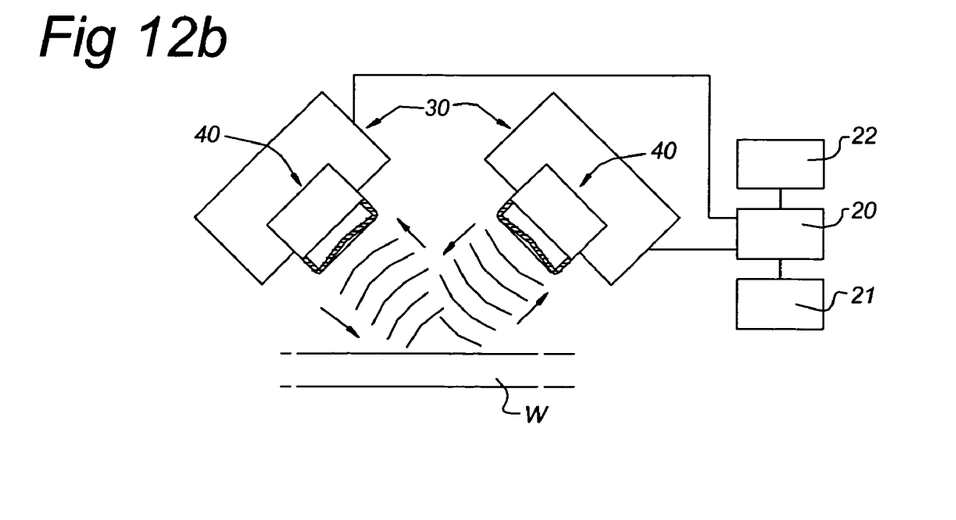

Another embodiment of the invention is shown in FIGS. 12a and 12b. According to the embodiments illustrated in FIG. 12a, the ultrasonic pressure wave may be emitted by a first transducer 40 at some well defined angle with respect to the surface of the substrate W. The generated pressure wave may be reflected by the substrate W and may be directed to an ultrasonic mirror 60. According to an alternative embodiment, schematically depicted in FIG. 12b, the ultrasonic mirror 60 may also be replaced by a second transducer 40. The second transducer may be arranged to start emitting when it is triggered by a pressure wave. Thus, as soon as the pressure wave generated by the first transducer 40 arrives at the second transducer 40, the second transducer may emit a pressure wave.

In both embodiments, as shown in FIGS. 12a and 12b, the first transducer 40 at least may be arranged to emit a pressure wave when it receives a pressure wave reflected by the ultrasonic mirror 60 or the second transducer 40. In both cases, an electromechanical oscillator is created. The oscillating frequency may be a measure for the height of the substrate W. This is an advantageous alternative, as frequency is a variable that can be measured easily and accurately.

Of course, such a electromechanical oscillator may also be created with a single transducer 40 positioned such that it emits pressure waves substantially perpendicular to the surface of the substrate W.

While specific embodiments of the invention have been described above, it will be appreciated that the invention may be practiced otherwise than as described. For example, the invention may include a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A level sensor for use in a lithographic apparatus to determine a height of a surface of a substrate, the level sensor comprising:

an emitter that is arranged to emit a signal directed to a predetermined position on the surface of the substrate such that the signal is at least partially reflected by the substrate to render a reflected signal;

a receiver that is arranged to receive at least part of the reflected signal; and a processor that determines the height of the surface of the substrate with respect to the level sensor based on the emitted and received signal, wherein the signal is a pressure wave.

2. The level sensor according to claim 1, wherein the signal is an ultrasonic pressure wave.

3. The level sensor according to claim 1, wherein the level sensor further comprises a clock, the processor being arranged to communicate with the clock to determine a first time $t_0$ at which the emitter emits the signal and a second time $t_1$ at which the receiver receives the reflected signal, wherein the processor computes the height based on a difference between the first time $t_0$ and the second time $t_1$.

4. The level sensor according to claim 1, wherein the level sensor is arranged to create an interference pattern from part of the emitted signal and at least part of the reflected signal and to determine the height based on the created interference pattern using phase-shifts.

5. The level sensor according to claim 1, wherein the lithographic apparatus includes a projection system and an ultrasonic mirror and wherein, during use, the level sensor is arranged to emit the signal such that the signal is at least reflected once by one of the projection system and the ultrasonic mirror before the signal is received by the receiver.

6. The level sensor according to claim 1, wherein the level sensor comprises a plurality of emitters and a plurality of corresponding receivers.

7. The level sensor according to claim 6, wherein the processor determines different heights based on measurements taken from the plurality of emitters and receivers, using Zernike polynomials.

8. The level sensor according to claim 1, wherein the emitter and the receiver are formed by a first transducer and a second transducer, the first and second transducers being arranged to receive the reflected signal and to emit a second signal upon receipt of the reflected signal such that an electromechanical oscillator is created, having a frequency that depends on the height of the substrate, the processor being arranged to compute the height of the surface of the substrate based on the measured frequency of the electromechanical oscillator.

9. The level sensor according to claim 1, wherein the level sensor further comprises probes to guide the emitted pressure waves from the emitter to the substrate W and from the substrate W to the receiver.

10. The level sensor according to claim 1, wherein the emitter is a laser source that is arranged to emit a laser pulse directed to the substrate, upon which the substrate emits a pressure wave that is received by the receiver.

11. The level sensor according to claim 1, wherein the level sensor comprises a transducer that includes both the emitter and the receiver.

12. The level sensor according to claim 1, wherein the emitter is a micro-electromechanical system sensor.

13. The level sensor according to claim 11, where the level sensor comprises a plurality of micro-electromechanical system sensors, wherein each micro-electromechanical system sensor is at least one of the receiver and the emitter.

14. A lithographic apparatus, comprising:

an illumination system configured to condition a radiation beam;

a support constructed to support a patterning device, the patterning device being capable of imparting the radiation beam with a patterned cross-section to form a patterned radiation beam;

a substrate table constructed to hold a substrate;

a projection system configured to project the patterned radiation beam onto a target portion of the substrate; and a level sensor that determines a height of a surface of the substrate, the level sensor including:
(i) an emitter that is arranged to emit a signal directed to a predetermined position on the surface of the substrate such that the signal is at least partially reflected by the substrate to render a reflected signal;
(ii) a receiver that is arranged to receive at least part of the reflected signal; and
(iii) a processor that determines the height of the surface of the substrate with respect to the level sensor based on the emitted and received signal;

wherein the signal is a pressure wave.

15. The lithographic apparatus according to claim 14, wherein the signal is an ultrasonic pressure wave.

16. A lithographic projection apparatus arranged to project a pattern from a patterning device onto a substrate, wherein the lithographic projection apparatus includes a level sensor comprising:

an emitter that is arranged to emit a signal directed to a predetermined position on the surface of the substrate such that the signal is at least partially reflected by the substrate to render a reflected signal;

a receiver that is arranged to receive at least part of the reflected signal; and a processor that determines the height of the surface of the substrate with respect to the level sensor based on the emitted and received signal;

wherein the signal is a pressure wave.

17. A method of determining a height of a surface of a substrate using a level sensor that includes an emitter and a receiver, the method comprising:

emitting a signal directed to a predetermined position on the surface of the substrate such that the signal is at least partially reflected by the substrate to render a reflected signal;

receiving at least part of the reflected signal; and computing the height of the surface of the substrate with respect to the level sensor based on the emitted and received signal;

wherein the signal is a pressure wave.

* * * * *